United States Patent
Song

(10) Patent No.: US 7,583,119 B2
(45) Date of Patent: Sep. 1, 2009

(54) DELAY LOCKED LOOP HAVING SMALL JITTER AND JITTER REDUCING METHOD THEREOF

(75) Inventor: In-Dal Song, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/832,504

(22) Filed: Aug. 1, 2007

(65) Prior Publication Data
US 2008/0030248 A1 Feb. 7, 2008

(30) Foreign Application Priority Data
Aug. 1, 2006 (KR) .................. 10-2006-0072659

(51) Int. Cl.
*H03L 7/06* (2006.01)
(52) U.S. Cl. .................................... 327/158; 327/149
(58) Field of Classification Search ................ 327/149, 327/156, 152, 153, 161, 233–237, 244
See application file for complete search history.

(56) References Cited

U.S. PATENT DOCUMENTS

| 5,126,693 | A | 6/1992 | Gulliver et al. | |
|---|---|---|---|---|
| 6,525,584 | B2 * | 2/2003 | Seo et al. | 327/276 |
| 6,570,944 | B2 * | 5/2003 | Best et al. | 375/355 |
| 6,617,909 | B2 * | 9/2003 | Shim | 327/355 |
| 6,650,157 | B2 * | 11/2003 | Amick et al. | 327/158 |
| 6,662,303 | B1 * | 12/2003 | Toosky et al. | 713/400 |
| 6,680,635 | B2 * | 1/2004 | Lee | 327/158 |
| 6,943,602 | B1 * | 9/2005 | Lee | 327/158 |
| 7,027,742 | B2 * | 4/2006 | Tanaka et al. | 398/185 |
| 7,161,397 | B2 * | 1/2007 | Lee et al. | 327/149 |

(Continued)

FOREIGN PATENT DOCUMENTS

KR 2003-0052651 6/2003

(Continued)

OTHER PUBLICATIONS

English language abstract of Korean Publication No. 2003-0052651.

(Continued)

*Primary Examiner*—Lincoln Donovan
*Assistant Examiner*—Adam D Houston
(74) *Attorney, Agent, or Firm*—Marger Johnson & McCollom, P.C.

(57) ABSTRACT

A delay locked loop includes an auxiliary phase shifter for controlling a phase blending point after the delay locked loop is initially locked, thereby reducing jitter. A control circuit directs a phase blender to detect the point where two delayed signals are phase-blended, and directs the auxiliary phase shifter to select between a delayed clock signal and a received clock signal. When the point where the two delayed signals are phase-blended is in-between first edges of the two delayed signals, the control circuit directs the auxiliary phase shifter to transmit the received clock signal without delaying the clock signal. When the point where the two delayed signals are phase-blended is close to at least one of the first edges of the two delayed signals, the control circuit directs the auxiliary phase shifter to delay the clock signal by a predefined time. As a result, bang-bang jitter in the delay locked loop is reduced.

15 Claims, 3 Drawing Sheets

U.S. PATENT DOCUMENTS

| | | | |
|---|---|---|---|
| 7,184,509 B2* | 2/2007 | Cho et al. | 375/373 |
| 7,271,634 B1* | 9/2007 | Daga et al. | 327/149 |
| 7,282,974 B2* | 10/2007 | Lee | 327/158 |
| 7,292,080 B2* | 11/2007 | Minzoni | 327/158 |
| 7,327,175 B2* | 2/2008 | Lee | 327/158 |
| 7,330,060 B2* | 2/2008 | Abel et al. | 327/158 |
| 7,368,963 B2* | 5/2008 | Lee | 327/158 |
| 7,368,965 B2* | 5/2008 | Drexler et al. | 327/158 |
| 7,375,565 B2* | 5/2008 | Kwak | 327/158 |
| 7,382,678 B2* | 6/2008 | Kim et al. | 365/233.1 |
| 7,385,428 B2* | 6/2008 | Lee et al. | 327/149 |
| 7,414,444 B2* | 8/2008 | Drexler et al. | 327/158 |
| 7,414,445 B2* | 8/2008 | Heyne | 327/158 |
| 7,423,462 B2* | 9/2008 | Drexler et al. | 327/158 |
| 2002/0140491 A1* | 10/2002 | Shim | 327/355 |
| 2005/0024117 A1* | 2/2005 | Kubo et al. | 327/258 |
| 2006/0001465 A1* | 1/2006 | Kwak et al. | 327/160 |
| 2006/0133557 A1* | 6/2006 | Freyman et al. | 375/362 |
| 2006/0170459 A1* | 8/2006 | Shin et al. | 326/113 |
| 2006/0192602 A1* | 8/2006 | Lee | 327/158 |
| 2006/0255844 A1* | 11/2006 | Drexler et al. | 327/158 |
| 2007/0046344 A1* | 3/2007 | Minzoni | 327/158 |
| 2007/0046347 A1* | 3/2007 | Lee | 327/158 |
| 2007/0103212 A1* | 5/2007 | Lee et al. | 327/149 |
| 2007/0132493 A1* | 6/2007 | Fujisawa et al. | 327/158 |
| 2007/0210843 A1* | 9/2007 | Takai | 327/158 |
| 2008/0054958 A1* | 3/2008 | Liu et al. | 327/149 |
| 2008/0088349 A1* | 4/2008 | Lee | 327/158 |
| 2008/0180181 A1* | 7/2008 | Wang et al. | 331/45 |
| 2008/0189568 A1* | 8/2008 | Kwak | 713/501 |
| 2008/0303571 A1* | 12/2008 | Motoyui | 327/161 |

FOREIGN PATENT DOCUMENTS

| | | |
|---|---|---|
| KR | 2005-0058918 | 6/2005 |
| KR | 2006-0000865 | 1/2006 |

OTHER PUBLICATIONS

English language abstract of Japanese Publication No. 2005-0058918.

English language abstract of Japanese Publication No. 2006-0000865.

* cited by examiner

DELAY LOCKED LOOP HAVING SMALL JITTER AND JITTER REDUCING METHOD THEREOF

CROSS-REFERENCE TO RELATED PATENT APPLICATION

This application claims the benefit of Korean Patent Application No. 10-2006-0072659, filed on Aug. 1, 2006, in the Korean Intellectual Property Office, the disclosure of which is incorporated herein in its entirety by reference.

BACKGROUND OF THE INVENTION

1. Field of the Invention

The present invention relates to a delay locked loop, and more particularly, to a delay locked loop having a small jitter and a jitter reducing method thereof.

2. Description of the Related Art

In an I/O interfacing method that synchronizes data with a clock signal and transmits the synchronized data between a memory and a memory controller in a system, it is very important to correctly synchronize the data with the clock signal—particularly when a bus load increases and a transmission frequency rises. To synchronize data with a clock signal, a phase locked loop and/or a delay locked loop may be used. In general, a memory device synchronizes data with a clock signal using a delay locked loop.

FIG. 1 shows a block diagram of a conventional register-controlled type delay locked loop generally corresponding with a block diagram disclosed in U.S. Patent Laid-Open Publication No. 2006/001465 A1. Referring to FIG. 1, the register-controlled type delay locked loop includes a buffer 11, a coarse delay line 12, a phase selector 13, a phase blender 14, a phase detector 15, and a control circuit 16. The register-controlled type delay locked loop has a coarse/fine loop structure. The coarse delay line 12—in the form of a tapped delay line—is used as a coarse loop. As for the fine loop structure, the phase blender 14 is used. The operation of the delay locked loop to reduce a phase error will be explained in further detail below.

The control circuit 16 generates an UP/DOWN signal in response to a lead/lag state using phase error information (a signal corresponding to a phase difference between a clock signal CLK and a feedback signal OCLK) detected by the phase detector 15. The coarse delay line 12 receives the clock signal CLK through the buffer 11 and sequentially delays the clock signal CLK by a unit delay time to output a plurality of delayed signals. The phase selector 13 selects two delayed signals $\phi_i$ and $\phi_j$ from the plurality of delayed signals. The two delayed signals $\phi_i$ and $\phi_j$ originate from two neighboring unit coarse delay cells among a plurality of unit coarse delay cells included in the coarse delay line 12.

Delayed signals $\phi_i$ (i=0, 2, 4, ...) are signals output from even-numbered delay cells from among the unit coarse delay cells in the coarse delay line 12. Similarly, delayed signals $\phi_j$ (j=1, 3, 5, ...) are signals output from odd-numbered delay cells from among the unit coarse delay cells in the coarse delay line 12.

The phase blender 14 phase-blends the two delayed signals $\phi_i$ and $\phi_j$ for fine locking and outputs the final output signal OCLK having minimum phase error.

In the conventional delay locked loop, however, bang-bang jitter increases, as illustrated in FIG. 2, when the two delayed signal $\phi_i$ and $\phi_j$ are phase-blended near the edge of the delayed signal $\phi_i$ or the edge of the delayed signal $\phi_j$. Accordingly, a need exists for a delay locked loop which is capable of reducing bang-bang jitter.

SUMMARY OF THE INVENTION

Example embodiments of the present invention provide a delay locked loop having small bang-bang jitter.

Example embodiments of the present invention also provide a method for reducing bang-bang jitter in a delay locked loop.

One example embodiment of the present invention includes a delay locked loop comprising a coarse delay line configured to receive an output signal, to sequentially delay the output signal by a unit delay time, and to transmit a plurality of delayed output signals, a phase selector configured to select two delayed output signals from the plurality of delayed output signals, a phase blender configured to phase-blend the two delayed output signals, a phase detector configured to compare a clock signal to the phase-blended signal, and to generate a detection signal corresponding to a phase difference between the clock signal and the phase-blended signal, an auxiliary phase shifter configured to receive the clock signal, to delay the clock signal by a predefined time, to select between the delayed clock signal and the received clock signal, and to transmit the selected clock signal as the received output signal.

Another example embodiment of the present invention includes a method for reducing jitter in a delay locked loop, comprising receiving an output signal from an auxiliary phase shifter, sequentially delaying the output signal by a unit delay time, transmitting a plurality of delayed output signals, selecting two delayed output signals from the plurality of delayed output signals, phase-blending the two delayed output signals, comparing a clock signal to the phase-blended signal, generating a detection signal corresponding to a phase difference between the clock signal and the phase-blended signal, receiving the clock signal at the auxiliary phase shifter, delaying the clock signal by a predefined time, selecting between the delayed clock signal and the received clock signal, and transmitting the selected clock signal as the received output signal.

BRIEF DESCRIPTION OF THE DRAWINGS

The foregoing and other features, objects, and advantages of the various example embodiments of the invention will become more readily apparent from the following detailed description, which proceeds with reference to the accompanying drawings.

DETAILED DESCRIPTION OF THE INVENTION

Figure 1:
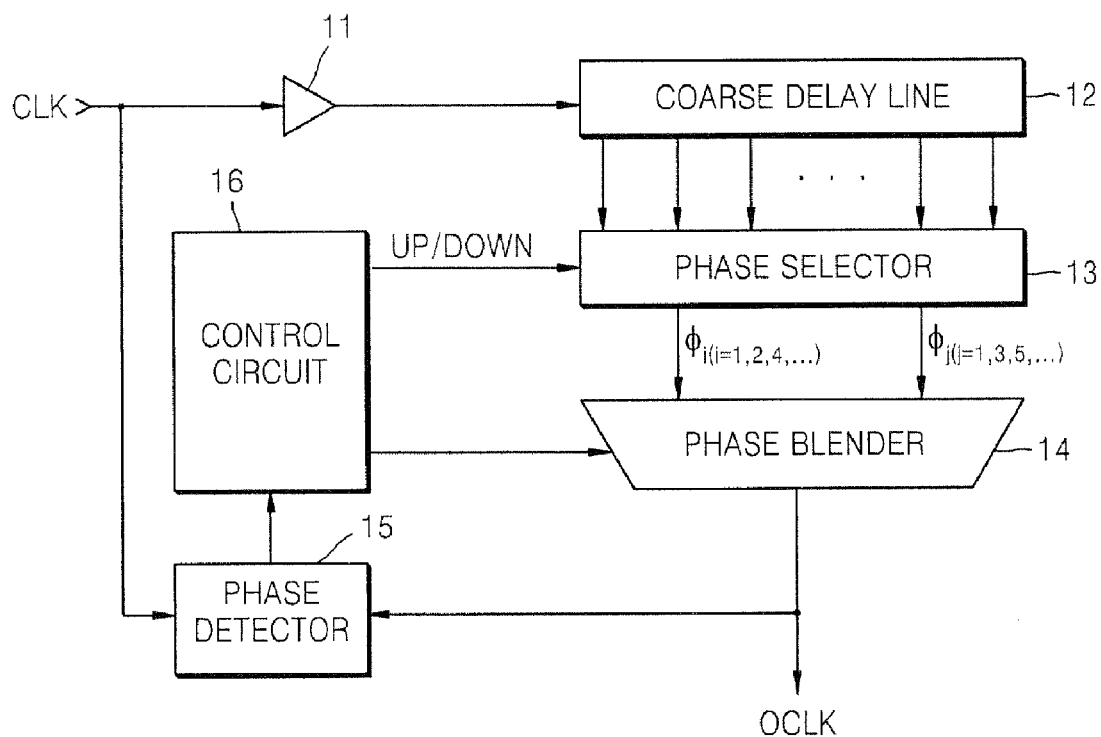
FIG. 1 shows a block diagram including a conventional register controlled type delay locked loop.
Figure 2:
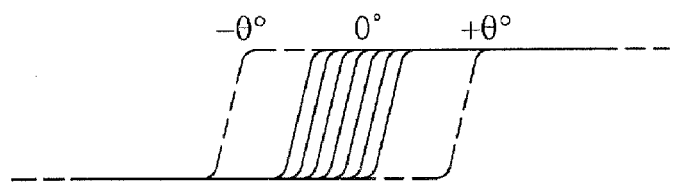
FIG. 2 illustrates phase blending in the delay locked loop illustrated in FIG. 1.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Throughout the drawings, like reference numerals refer to like elements.

Figure 3:
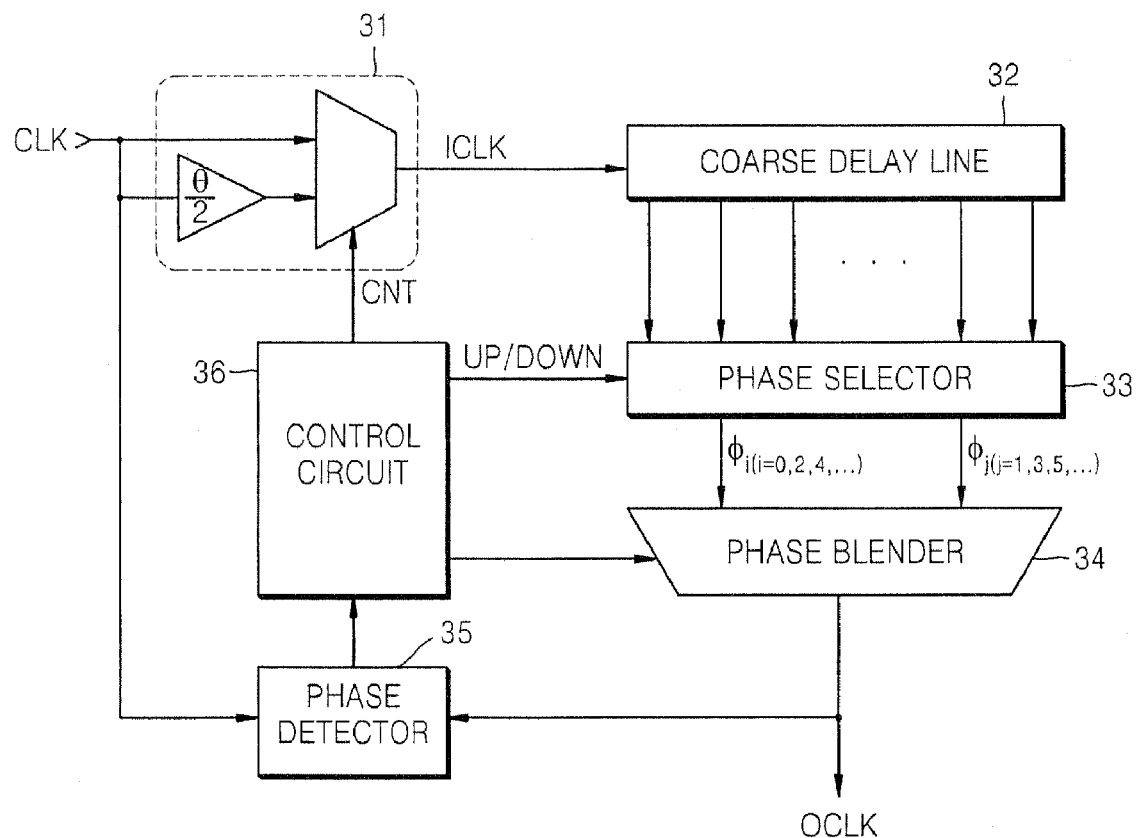
FIG. 3 shows a block diagram including a delay locked loop according to an embodiment of the present invention.

FIG. 3 shows a block diagram including a delay locked loop according to an embodiment of the present invention. Referring to FIG. 3, the delay locked loop, according to an embodiment of the present invention, may include an auxiliary phase shifter 31, a coarse delay line 32, a phase blender 34, a phase detector 35, and a control circuit 36. The delay locked loop may be of the register-controlled type and has a coarse/fine loop structure. The coarse delay line 32—in the form of a tapped delay line—may be used as a coarse loop, and the phase blender 34 may be used as a fine loop.

The auxiliary phase shifter 31 may control a phase blending point of the phase blender 34 after the delay locked loop is initially locked. The auxiliary phase shifter 31 may be controlled by the control circuit 36. The auxiliary phase shifter 31 may receive a clock signal CLK and may output the clock signal CLK without delaying it. Alternatively, the auxiliary phase shifter 31 may delay the clock signal CLK by a predefined time $\theta/2$ responsive to a control signal CNT generated by the control circuit 36.

The coarse delay line 32 may include a plurality of unit coarse delay cells connected in series, receive the output signal ICLK of the auxiliary phase shifter 31, and sequentially delay the output signal ICLK by a unit delay time $\theta$ through the unit coarse delay cells to output a plurality of delayed signals. The predefined time $\theta/2$ of the auxiliary phase shifter 31 may be set to half the unit delay time $\theta$ of the unit coarse delay cells included in the coarse delay line 32.

The phase selector 33 may select two delayed signals $\phi_i$ and $\phi_j$ from the plurality of delayed signals. The two delayed signals $\phi_i$ and $\phi_j$, originating from two neighboring unit coarse delay cells among a plurality of unit coarse delay cells included in the coarse delay line 12, may be selected responsive to an UP/DOWN signal generated by the control circuit 36.

Delayed signals $\phi_i$ (i=0, 2, 4, . . . ) are signals output from even-numbered delay cells from among the unit coarse delay cells included in the coarse delay line 32, and delayed signals $\phi_j$ (j=1, 3, 5, . . . ) are signals output from odd-numbered delay cells from among the unit coarse delay cells included in the coarse delay line 32.

The phase blender 34 may phase-blend the two delayed signals $\phi_i$ and $\phi_j$ and output a feedback signal OCLK having minimum phase error for fine locking. The phase detector 35 may compare the clock signal CLK to the feedback signal OCLK and generate a detection signal corresponding to a phase difference between the clock signal CLK and the feedback signal OCLK.

The control circuit 36 may generate the control signal CNT for controlling the auxiliary phase shifter 31 and the UP/DOWN signal for controlling the phase selector 33 responsive to phase error information detected by the phase detector 35. In addition, the control circuit 36 may control the phase blender 34, and detect whether the delay locked loop is initially locked.

When the control circuit 36 detects that the delay locked loop is not initially locked, the control circuit 36 may direct the auxiliary phase shifter 31 to output the clock signal CLK without a delay. Alternatively, when the control circuit 36 detects that the delay locked loop is initially locked, the control circuit 36 may direct the phase blender 34 to detect a point where the two delayed signals $\phi_i$ and $\phi_j$ are phase-blended. The control circuit 36 may then direct the auxiliary phase shifter 31 to output the clock signal CLK either with or without a delay responsive to the detection result of the phase blender 34. If the auxiliary phase shifter 31 is directed to output the clock signal CLK with a delay, the delay may be a predefined time, such as $\theta/2$.

Figure 4:
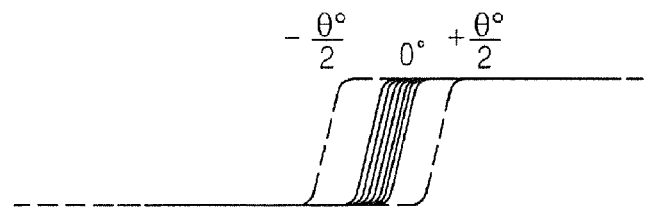
FIG. 4 illustrates phase blending in the delay locked loop illustrated in FIG. 3.

Moreover, when the phase-blended point of the two delayed signals $\phi_i$ and $\phi_j$ is located between first edges (e.g., a rising edge of the signal $\phi_i$ and a rising edge of the signal $\phi_j$), the control circuit 36 may direct the auxiliary phase shifter 31 to output the clock signal CLK without a delay. Otherwise, when the point is close to one of the first edges of the two delayed signals $\phi_i$ and $\phi_j$, the control circuit 36 may direct the auxiliary phase shifter 31 to delay the clock signal CLK by the predefined time $\theta/2$, and output the delayed clock signal. That is, the auxiliary phase shifter 31 may delay the clock signal CLK by the predefined time $\theta/2$ such that the two delayed signals $\phi i$ and $\phi j$ are not phase-blended near one of the first edges of the two delayed signals $\phi_i$ and $\phi_j$, but rather, phase-blended in-between the first edges. Accordingly, bang-bang jitter is reduced in the delay locked loop according to an embodiment of the present invention, as illustrated in FIG. 4.

Figure 5:
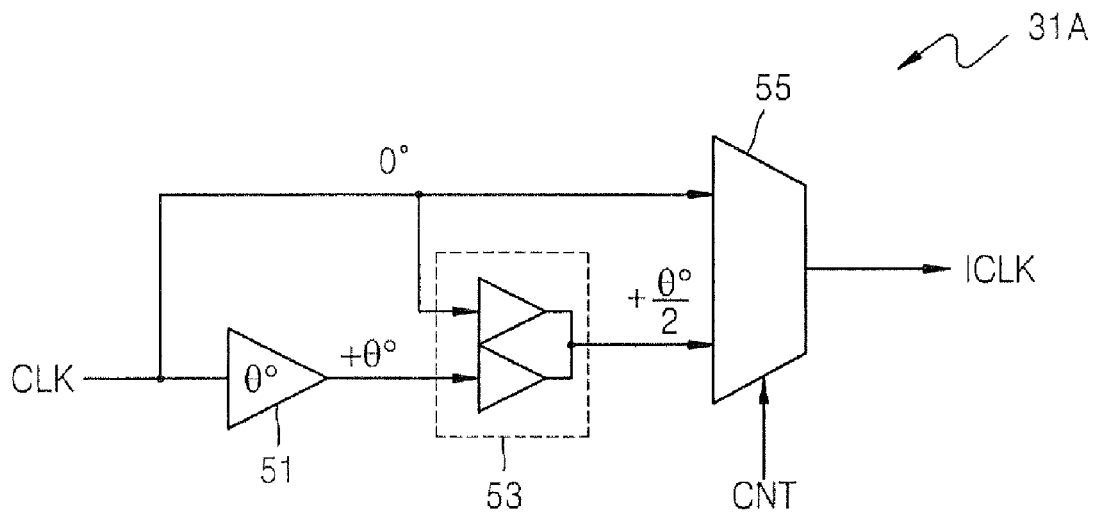
FIG. 5 shows a circuit diagram including an auxiliary phase shifter illustrated in FIG. 3 according to an embodiment of the present invention.

FIG. 5 shows a circuit diagram including an auxiliary phase shifter 31A illustrated in FIG. 3 according to an embodiment of the present invention. Referring to FIG. 5, the auxiliary phase shifter 31A may include a delay cell 51 to delay the clock signal CLK by the unit delay time $\theta$, and a phase blender 53 to phase-blend the clock signal CLK and the output signal of the delay cell 51. The auxiliary phase shifter 31A may also include a selector 55 to select one of the clock signal CLK and the output signal of the phase blender 53 responsive to the control signal CNT, and to output the selected signal as an output signal ICLK.

The output signal of the phase blender 53 may be delayed from the clock signal CLK by $\theta/2$. This is accomplished when the phase blender 53 phase-blends the clock signal CLK and the output signal of the delay cell 51. The control signal CNT may be generated by the control circuit 36 illustrated in FIG. 3. The control circuit 36 may generate the control signal CNT in a first logic state when the delay locked loop is not initially locked, and thus, selector 55 may select the clock signal CLK as the output signal ICLK.

When the phase-blended point of the two delayed signals $\phi_i$ and $\phi_j$ is located in-between the first edges (e.g., a rising edge of the signal $\phi_i$ and a rising edge of the signal $\phi_j$), the control circuit 36 may generate the control signal CNT in the first logic state. Thus, the selector 55 may select the clock signal CLK and output it as the output signal ICLK. Otherwise, when the phase-blended point of the two delayed signals $\phi_i$ and $\phi_j$ is located close to one of the first edges (e.g., a rising edge of the signal $\phi_i$ and a rising edge of the signal $\phi_j$), the control circuit 36 may generate the control signal CNT in a second logic state. Accordingly, the selector 55 may select the output signal of the phase blender 53 corresponding to the signal delayed from the clock signal CLK by $\theta/2$, and output it as the output signal ICLK.

Figure 6:
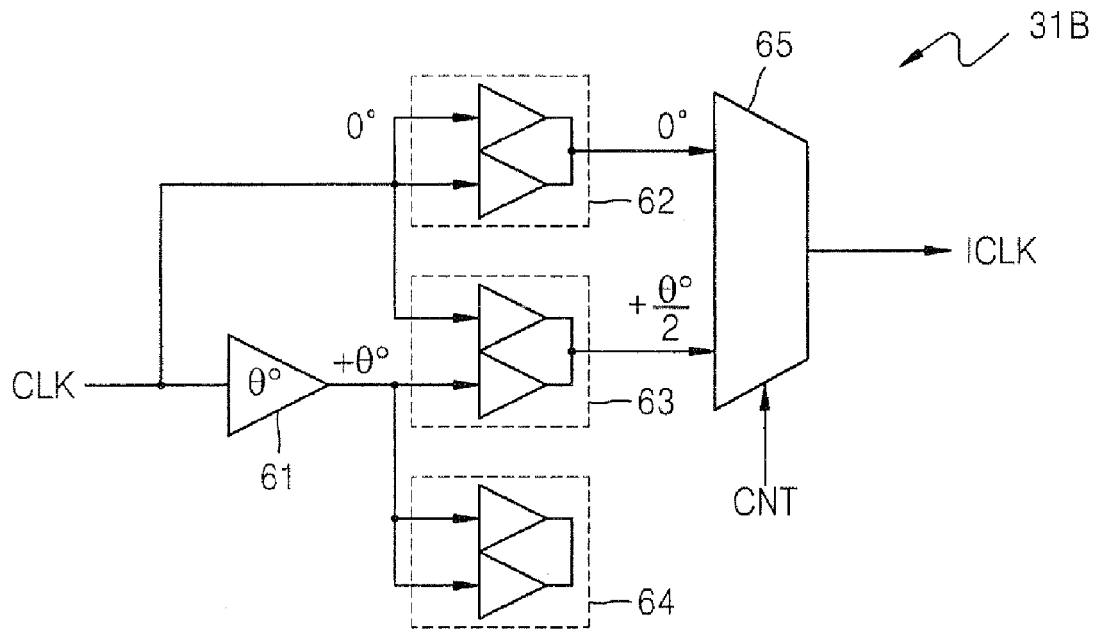
FIG. 6 shows a circuit diagram including the auxiliary phase shifter illustrated in FIG. 3 according to another embodiment of the present invention.

FIG. 6 shows a circuit diagram including the auxiliary phase shifter 31B illustrated in FIG. 3 according to another embodiment of the present invention. Referring to FIG. 6, the auxiliary phase shifter 31B may include a delay cell 61, a first phase blender 62, a second phase blender 63, a third phase blender 64, and a selector 65. The auxiliary phase shifter 31B may include two additional phase blenders (e.g., 62 and 64) beyond those shown in the auxiliary phase shifter 31A illustrated in FIG. 5. One purpose for including the additional phase blenders is to make the load of input terminals of the first phase blender 62 substantially equal to the load of input terminals of the second phase blender 63. Another purpose is to make the load of an output terminal of the first phase blender 62 substantially equal to the load of an output terminal of the second phase blender 63.

The delay cell 61 may delay the clock signal CLK by the unit delay time θ. The first phase blender 62 may receive the clock signal CLK through two input terminals, phase-blend the two signals input through the two input terminals, and output the phase-blended signal to the selector 65. The output signal of the first phase blender 62 is not delayed from the clock signal CLK.

The second phase blender 63 may phase-blend the clock signal CLK and the output signal of the delay cell 61, and output the phase-blended signal to the selector 65. The output signal of the second phase blender 63 may be delayed from the clock signal CLK by θ/2. This is accomplished when the second phase blender 63 phase-blends the clock signal CLK and the output signal of the delay cell 61. The third phase blender 64 may receive the output signal of the delay cell 61 through two input terminals and may phase-blend the two signals input through the input terminals.

The selector 65 may select one of the output signals of the first and second phase blenders 62 and 63 responsive to a control signal CNT, and output the selected signal as the output signal ICLK. The control signal CNT may be identical to the control signal CNT illustrated in FIG. 5 and may be generated by the control signal 36 illustrated in FIG. 3.

As described above, the delay locked loop—according to embodiments of the present invention—controls two delayed signals to be phase-blended between first edges of the two delayed signals (after the delay locked loop is initially locked) when phase-blending would otherwise be carried out near one of the first edges of the two delayed signals. This reduces bang-bang jitter in the delay locked loop.

While the present invention has been particularly shown and described with reference to exemplary embodiments thereof; it will be understood by those of ordinary skill in the art that various changes in form and details may be made therein without departing from the spirit and scope of the present invention as defined by the following claims.

What is claimed is:

1. A delay locked loop comprising:
a coarse delay line configured to receive an output signal, to sequentially delay the output signal by a delay time, and to transmit a plurality of delayed output signals;
a phase selector configured to select two delayed output signals from the plurality of delayed output signals;
a phase blender configured to phase-blend the two delayed output signals;
a phase detector configured to compare a clock signal to the phase-blended signal, and to generate a detection signal corresponding to a phase difference between the clock signal and the phase-blended signal;
an auxiliary phase shifter configured to receive the clock signal, to delay the clock signal by a predefined time, to select between the delayed clock signal and the received clock signal, and to transmit the selected clock signal as the received output signal; and
a control circuit configured to control the auxiliary phase shifter, the phase selector, and the phase blender responsive to the detection signal.

2. The delay locked loop of claim 1, wherein the course delay line is configured to sequentially delay the output signal by a unit delay time, and wherein the predefined time corresponds to a half of the unit delay time.

3. The delay locked loop of claim 1, wherein the auxiliary phase shifter comprises:
a delay cell configured to delay the clock signal by the delay time;
a phase blender configured to phase-blend the clock signal and the output signal of the delay cell; and
a selector configured to select one of the clock signal and the output signal of the phase blender.

4. The delay locked loop of claim 1, wherein the auxiliary phase shifter comprises:
a delay cell configured to delay the clock signal by the delay time;
a first phase blender configured to receive the clock signal through two input terminals, and to phase-blend two signals respectively received through the two input terminals;
a second phase blender configured to phase-blend the clock signal and the output signal of the delay cell;
a third phase blender configured to receive the output signal of the delay cell through two input terminals, and to phase-blend two signals respectively received through the two input terminals; and
a selector configured to select one of an output signal of the first phase blender and an output signal of the second phase blender.

5. The delay locked loop of claim 1, wherein the control circuit is configured to detect whether the delay locked loop is initially locked, and to direct the auxiliary phase shifter to transmit the clock signal without delaying the clock signal when the delay locked loop is not initially locked.

6. The delay locked loop of claim 1, wherein, when the delay locked loop is initially locked, the control circuit is configured to direct the phase blender to detect a point where the two delayed output signals are phase-blended, and to direct the auxiliary phase shifter to select between the delayed clock signal and the received clock signal, responsive to the detection result of the phase blender.

7. The delay locked loop of claim 1, wherein the control circuit is configured to direct the auxiliary phase shifter to transmit the received clock signal without delaying the clock signal when a point where the two delayed output signals are phase-blended is substantially in-between first edges of the two delayed output signals.

8. The delay locked loop of claim 1, wherein the control circuit is configured to direct the auxiliary phase shifter to delay the clock signal by the predefined time when a point where the two delayed output signals are phase-blended is substantially close to at least one of first edges of the two delayed output signals.

9. The delay locked loop of claim 1, wherein the coarse delay line includes a plurality of unit coarse delay cells connected in series, which are configured to transmit the plurality of delayed output signals.

10. The delay locked loop of claim 9, wherein the two delayed output signals are transmitted from two neighboring delay cells from among the plurality of unit coarse delay cells.

11. A method for reducing jitter in a delay locked loop, comprising:
- receiving an output signal from an auxiliary phase shifter;
- sequentially delaying the output signal by a delay time;
- transmitting a plurality of delayed output signals;
- selecting two delayed output signals from the plurality of delayed output signals;
- phase-blending the two delayed output signals;
- comparing a clock signal to the phase-blended signal;
- generating a detection signal corresponding to a phase difference between the clock signal and the phase-blended signal;
- receiving the clock signal at the auxiliary phase shifter;
- delaying the clock signal by a predefined time;
- selecting between the delayed clock signal and the received clock signal;
- transmitting the selected clock signal as the received output signal;
- detecting whether the delay locked loop is initially locked;
- providing the clock signal as an input signal of a coarse delay line without delaying the clock signal when the delay locked loop is not initially locked; and
- providing one of a) the clock signal without delaying the clock signal and b) the clock signal delayed by the predefined time, when the delay locked loop is initially locked.

12. The method of claim 11, wherein sequentially delaying includes delaying the output signal line by a unit delay time, and wherein the predefined time corresponds to a half of the unit delay time.

13. The method of claim 11, wherein selecting between the delayed clock signal and the received clock signal occurs responsive to detecting a point where the two delayed output signals are phase-blended.

14. The method of claim 13, wherein when the point where the two delayed output signals are phase-blended is substantially in-between first edges of the two delayed output signals, transmitting the clock signal without delaying the clock signal.

15. The method of claim 13, wherein when the point where the two delayed output signals are phase-blended is substantially close to at least one of the first edges of the two delayed output signals, delaying the clock signal by the predefined time prior to transmitting the clock signal.

* * * * *

UNITED STATES PATENT AND TRADEMARK OFFICE
CERTIFICATE OF CORRECTION

PATENT NO.         : 7,583,119 B2
APPLICATION NO.    : 11/832504
DATED              : September 1, 2009
INVENTOR(S)        : In-Dal Song It is certified that error appears in the above-identified patent and that said Letters Patent is hereby corrected as shown below:

Column 5, line 48, the word "thereof;" should read -- thereof, --.

Signed and Sealed this

First Day of December, 2009

David J. Kappos
*Director of the United States Patent and Trademark Office*